United States Patent
Wu et al.

(10) Patent No.: US 9,287,361 B2
(45) Date of Patent: Mar. 15, 2016

(54) JUNCTION-LESS TRANSISTOR HAVING REVERSE POLARITY STRUCTURE

(71) Applicant: National Tsing Hua University, Hsinchu (TW)

(72) Inventors: Yung-Chun Wu, Hsinchu (TW); Ming-Hung Han, Hsinchu (TW); Hung-Bin Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 30 days.

(21) Appl. No.: 14/146,320

(22) Filed: Jan. 2, 2014

(65) Prior Publication Data
US 2014/0291739 A1    Oct. 2, 2014

(30) Foreign Application Priority Data
Mar. 28, 2013   (TW) .............................. 102111119 A

(51) Int. Cl.
*H01L 29/76*   (2006.01)
*H01L 29/10*   (2006.01)
*H01L 29/78*   (2006.01)

(52) U.S. Cl.
CPC ............ *H01L 29/1095* (2013.01); *H01L 29/78* (2013.01); *H01L 29/785* (2013.01)

(58) Field of Classification Search
CPC ................ H01L 29/1095; H01L 29/78; H01L 21/823431; H01L 21/823821; H01L 27/0886; H01L 27/088; H01L 29/66477

USPC .......... 257/191, 368, 288, 339, 369; 438/151, 438/197, 199
See application file for complete search history.

(56) References Cited

U.S. PATENT DOCUMENTS

| | | | |
|---|---|---|---|
| 7,199,000 B2 | 4/2007 | Fukuda | |
| 8,194,468 B2* | 6/2012 | Horch | G11C 11/5621 365/185.05 |
| 2008/0054346 A1* | 3/2008 | Saitoh | H01L 21/845 257/324 |
| 2013/0181256 A1* | 7/2013 | Gossner | H01L 29/083 257/191 |
| 2014/0239390 A1* | 8/2014 | Darwish | H01L 29/408 257/339 |

* cited by examiner

*Primary Examiner* — Jarrett Stark
*Assistant Examiner* — Shahed Ahmed
(74) *Attorney, Agent, or Firm* — Muncy, Geissler, Olds & Lowe, P.C.

(57) ABSTRACT

A junction-less transistor having an reverse polarity structure includes a substrate, a semiconductor body, a gate and a gate insulation layer. The substrate has a first polarity. The semiconductor body is disposed on the substrate, and includes a drain, a source and a channel section connected between the drain and the source. The gate covers one side of the channel section away from the substrate. The semiconductor body has a second polarity opposite to the first polarity. With the semiconductor body and the substrate respectively having the opposite second polarity and first polarity, a leakage current can be reduced while also lowering element production costs.

7 Claims, 5 Drawing Sheets

JUNCTION-LESS TRANSISTOR HAVING REVERSE POLARITY STRUCTURE

FIELD OF THE INVENTION

The present invention relates to a semiconductor element, and particularly to a junction-less transistor.

BACKGROUND OF THE INVENTION

With fast advancements in electronic products, designs of integrated circuits gradually progress towards high-density developments to satisfy market requirements, and so a size of a semiconductor element is constantly miniaturized in response. Due to structural issues, a conventional transistor encounters various challenges such as a short-channel effect during the miniaturization process. That is, with a shortened channel, a threshold voltage (Vth) of a transistor is decreased to lead to an increased leakage current that further incurs a power consumption problem.

The U.S. Pat. No. 7,199,000 discloses a method for fabricating a semiconductor element. In the above disclosure, to suppress short-channel effect, a transistor is fabricated on a silicon-on-insulator (SOI) to reduce a leakage current.

However, such type of SOI made of silicon dioxide is more costly than a monocrystalline silicon substrate utilized by a common semiconductor fabrication process. As a result, production costs involving the SOI made of silicon dioxide are raised to lead to a high production cost issue, which degrades price competitiveness compared to a conventional semiconductor element.

SUMMARY OF THE INVENTION

Therefore the primary object of the present invention is to provide a solution for overcoming high production costs due to an SOI utilized for reducing a leakage current in a conventional transistor.

To achieve the above object, a junction-less transistor having a reverse polarity structure is provided. The junction-less transistor comprises a substrate, a semiconductor body, a gate and a gate insulation layer. The substrate has a first polarity. The semiconductor body is disposed on the substrate, and comprises a drain, a source, and a channel section connected between the drain and the source. The gate covers one side of the channel section away from the substrate. The gate insulation layer is disposed between the gate and the channel section.

The semiconductor body has a second polarity opposite to the first polarity.

As such, with the semiconductor body and the substrate having the opposite first polarity and second polarity, the present invention provides at least the advantages below.

First of all, electrons in the channel section are affected by a junction electric field in the channel section and between the gate insulation layer and the substrate to suppress surface scattering and to reduce a leakage current.

Secondly, as the substrate may be made of more readily acquirable monocrystalline silicon of a common semiconductor fabrication process, the present invention has a lower cost for reduced production costs compared to an SOI substrate made of silicon dioxide.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
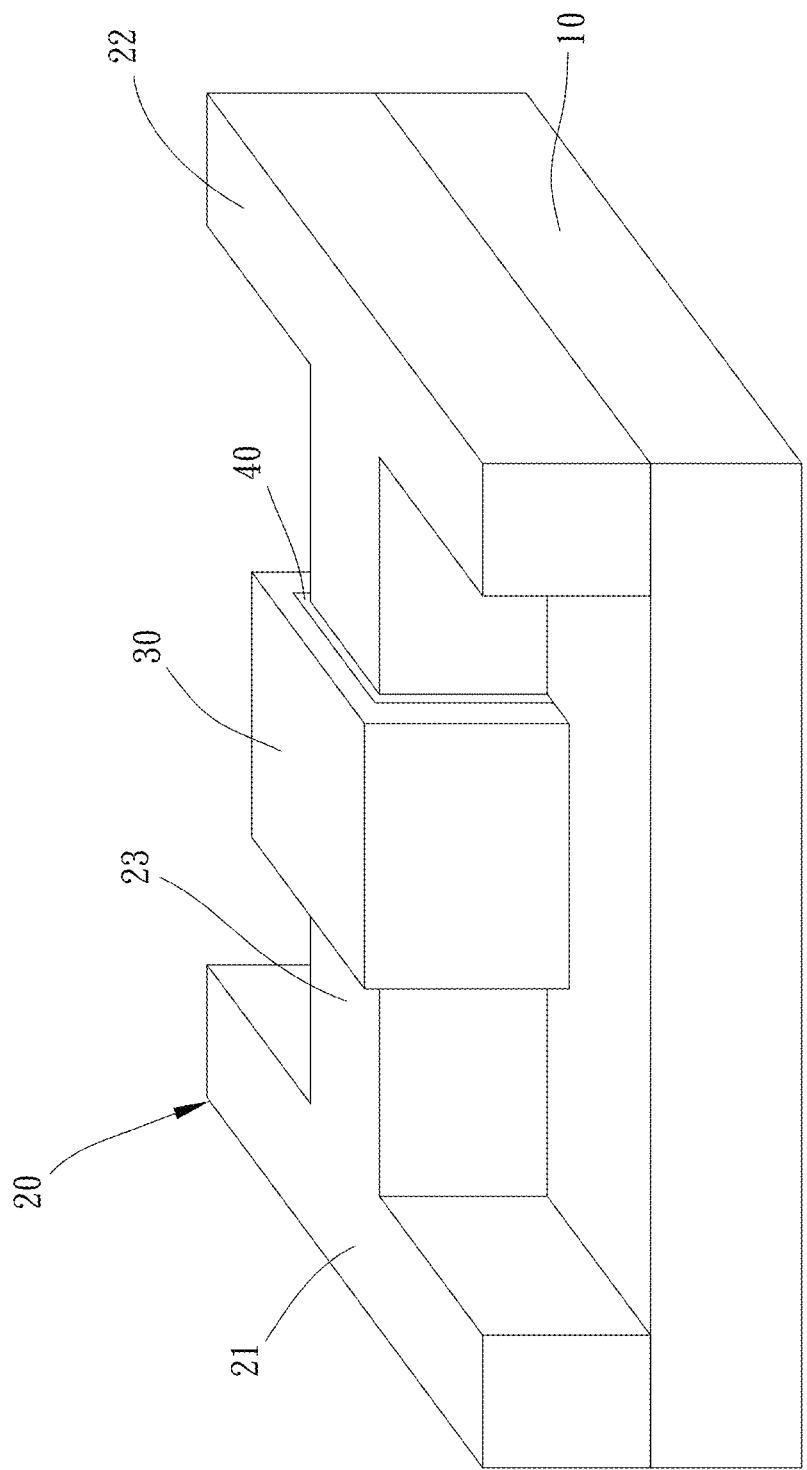
FIG. 1 is an elevational view according to an embodiment of the present invention.

FIG. 1 shows an elevational view of a junction-less transistor having a reverse polarity structure according to an embodiment of the present invention. Referring to FIG. 1, the junction-less transistor comprises a substrate 10, a semiconductor body 20, a gate 30 and a gate insulation layer 40. In the embodiment, the substrate 10 may be made of monocrystalline silicon. In an alternative embodiment, the substrate 10 may be made of thin-film silicon, monocrystalline silicon germanium, or gallium arsenide. The substrate 10 has a first polarity. The first polarity can be formed with P-type doping or N-type doping at a doping concentration between $10^{15}$ and $10^{20}$ cm$^{-3}$, e.g., $5 \times 10^{18}$ cm$^{-3}$ in the embodiment. The first polarity may also be formed by applying a bias voltage to the substrate 10.

The semiconductor body 20 is disposed on the substrate 10, and may be made of monocrystalline silicon, thin-film silicon, monocrystalline silicon germanium or gallium arsenide. In the embodiment, the semiconductor body 20 is made of a same material as the substrate 10. The semiconductor body 20 comprises a drain 21, a source 22, and a channel section 23 connected to the drain 21 and the source 22. Further, the semiconductor body 20 has a second polarity opposite to the first polarity. The second polarity may also be formed by N-type doping or P-type doping. When the substrate 10 is P-type doped, the semiconductor body 20 is N-type doped; when the substrate 10 is N-type doped, the semiconductor body 20 is P-type doped. For example, the doping concentration may be between $1 \times 10^{18}$ cm$^{-3}$ and $1 \times 10^{20}$ cm$^{-3}$, and is $1.5 \times 10^{19}$ cm$^{-3}$ in the embodiment.

The gate 30 covers one side of the channel section 23 away from the substrate 10. In the embodiment, the channel section 23 comprises a lower plane in contact with the substrate 10, an upper plane away from the lower plane, and two side planes connected to the lower plane and the upper plane. The gate 30 covers the upper plane and the two side planes of the channel section 23. The channel section 23 has a thickness of approximately 10 nm. The gate 30 may be made of titanium aluminum nitride, tantalum, titanium, wolfram, ruthenium, platinum, tantalum nitride, molybdenum nitride and wolfram nitride, and has a length of approximately 15 nm. The gate insulation layer 40, disposed between the gate 30 and the channel section 23, may be made of a high dielectric material such as hafnium oxide, silicon oxide nitride, silicon nitride, aluminum oxide and zirconium oxide, and has a thickness of approximately 1 nm.

Figure 2:
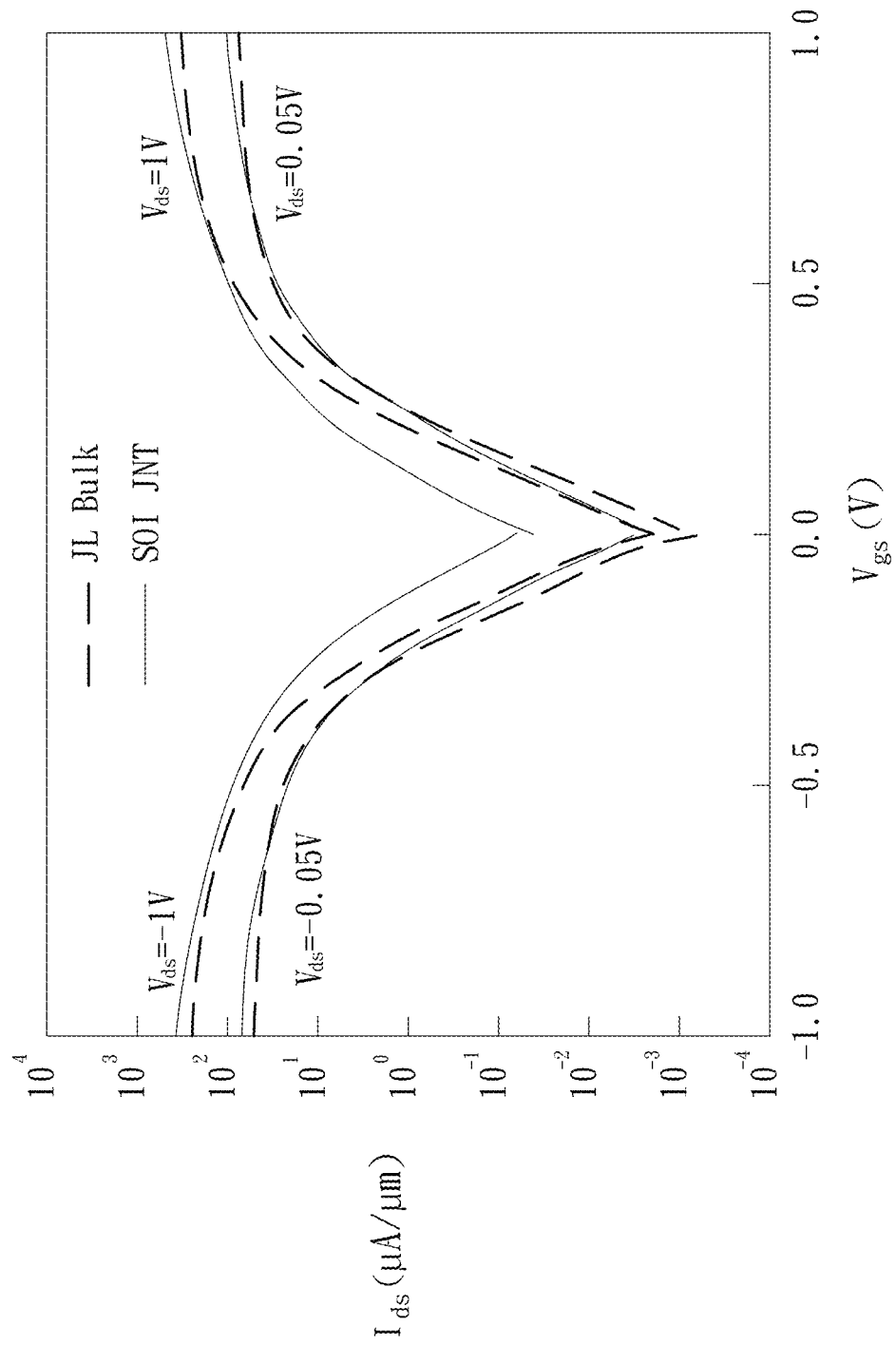
FIG. 2 is a comparison diagram of curves representing DC characteristics of a junction-less transistor according to an embodiment and a conventional junction-less transistor with SOI.

FIG. 2 shows a comparison diagram of curves representing DC characteristics of a junction-less transistor according to an embodiment and a conventional junction-less transistor on an SOI. In FIG. 2, the horizontal axis represents a voltage $V_{gs}$, and the vertical axis represents a current $I_{ds}$. It should be noted that, the conventional junction-less transistor formed on the SOI is similar to a junction-less transistor formed by the semiconductor body 20, the gate 30 and the gate insulation layer 40 of the present invention. A main difference of the present invention from the conventional structure is that, the conventional junction-less transistor in the transistor is formed on the SOI, whereas the junction-less transistor of the present invention is formed on the substrate 10. Referring to FIG. 2, comparing the junction-less transistor (JL Bulk) having the reverse polarity structure of the present invention to the conventional junction-less transistor (SOI JNT) on the SOI both in P-type, when $V_{ds}$ is 1V and 0.05V, the present invention provides a conduction current substantially equal to that of the junction-less transistor on the SOI but a cut-off current far smaller than that of the junction-less transistor on the SOI. That is to say, the present invention provides a preferred on/off current ratio. Further, in the present invention, a drain induced barrier lowering (DIBL) and a sub-threshold swing (SS) are respectively 40.4 mV and 73.1 mV/Dec, whereas the DIBL and SS of the junction-less transistor on the SOI are 119.2 mV and 84.1 mV/Dec, respectively. Therefore, the present invention is capable of reducing influences of a short-channel effect. Further, similar characteristics are also produced for N-type.

Figure 3A:
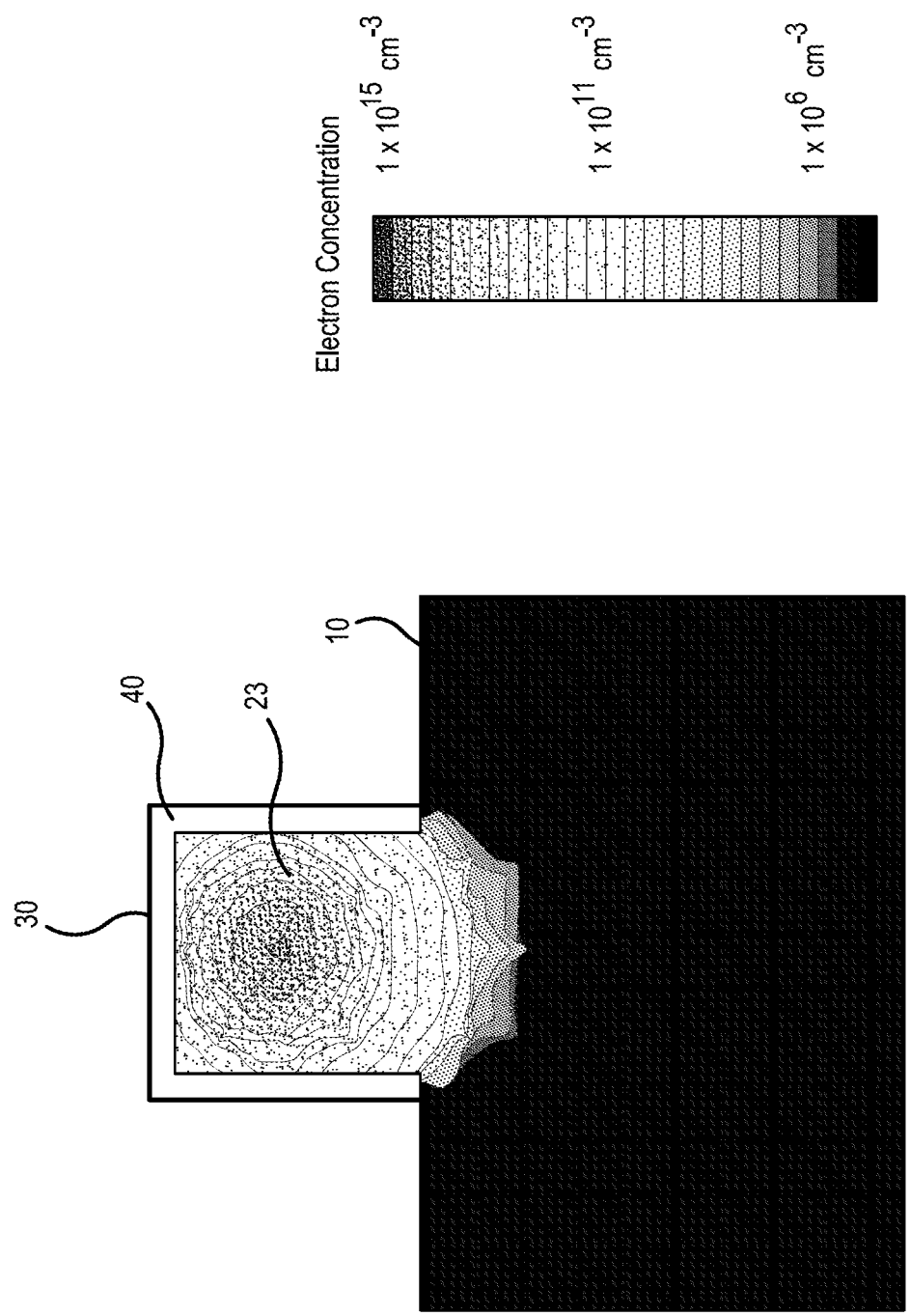
FIG. 3A is a schematic diagram of a channel electron concentration distribution according to an embodiment of the present invention.
Figure 3B:
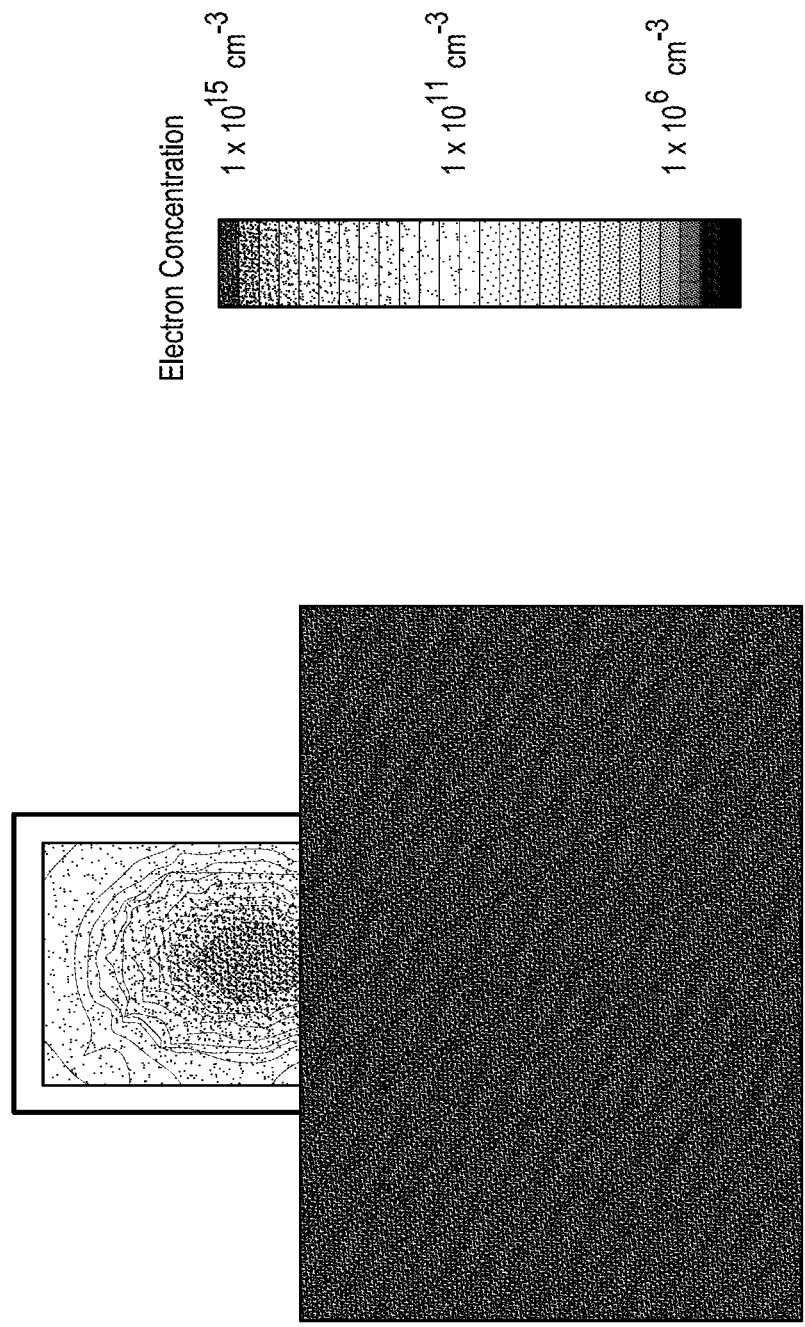
FIG. 3B is a schematic diagram of a channel electron concentration distribution of a conventional junction-less transistor with SOI.

FIG. 3A shows a schematic diagram of an electron concentration distribution in a channel section according to an embodiment of the present invention. FIG. 3B shows a schematic diagram of an electron concentration distribution in a channel section of a conventional junction-less transistor on an SOI. Comparing the junction-less transistor having the reverse polarity structure of the present invention to the conventional junction-less transistor on the SOI, electrons in the channel section 23 are mostly gathered at positions of the junction plane away from the channel section 23 and between the substrate 10, thus demonstrating that the present invention effectively suppresses surface scattering to reduce a leakage current.

Figure 4:
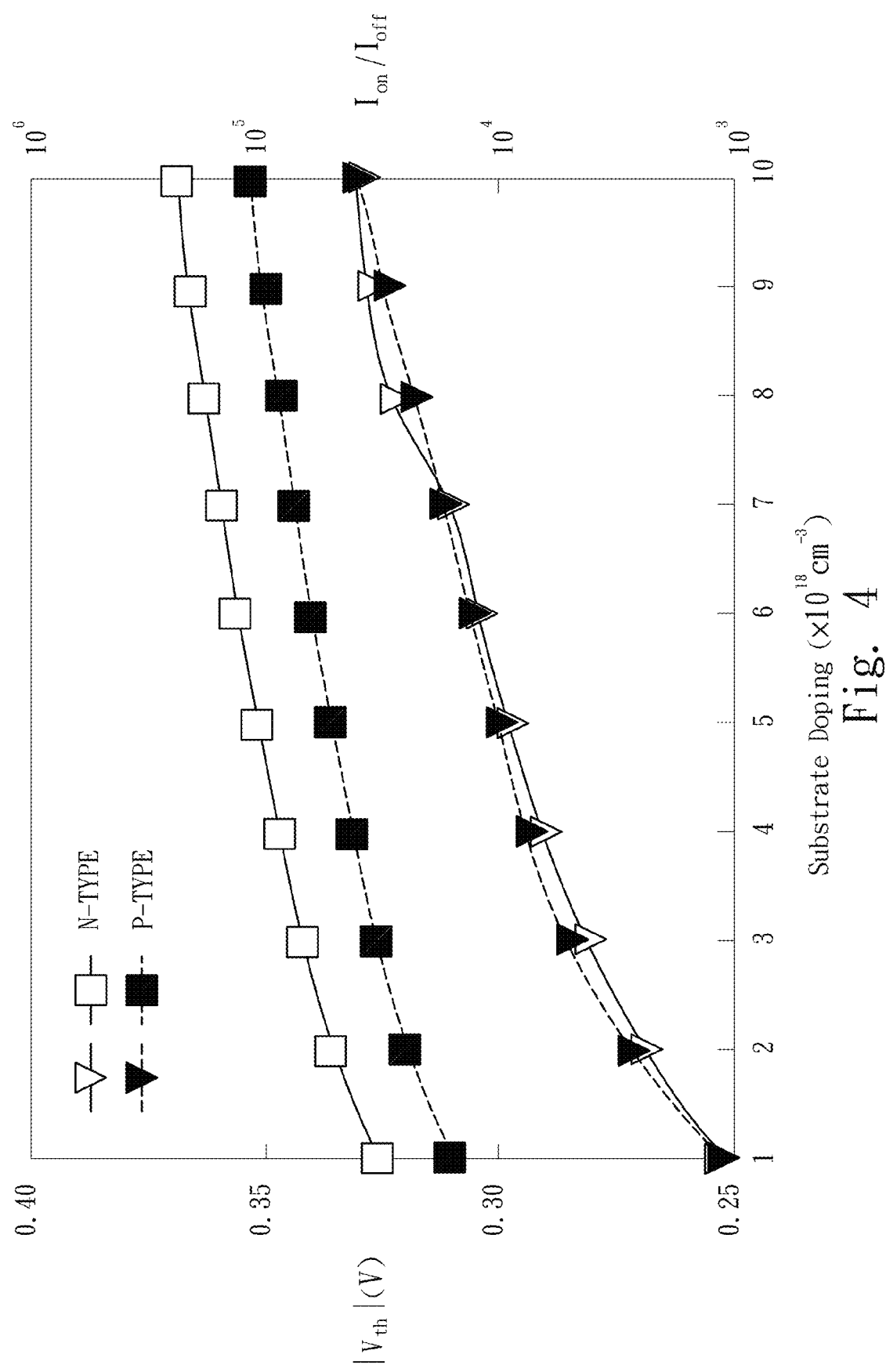
FIG. 4 is a relationship diagram between a substrate doping concentration and a threshold voltage according to an embodiment of the present invention.

FIG. 4 shows a relationship diagram between a substrate doping concentration and a threshold voltage according to an embodiment of the present invention. Referring to FIG. 4, for both N-type and P-type doping, a range of the threshold voltage $V_{th}$ can be adjusted in the present invention by changing the doping concentration of the substrate 10. When the doping concentration is adjusted from $10^{18}$ cm$^{-3}$ to $10^{19}$ cm$^{-3}$, an adjusted range of the threshold voltage is approximately 30%.

As such, with the semiconductor body and the substrate having the opposite second polarity and first polarity, the present invention provides at least the advantages below.

First of all, electrons in the channel section are affected by a junction electric field in the channel section and between the gate insulation layer and the substrate to suppress surface scattering and to reduce a leakage current.

Secondly, as the substrate may be made of more readily acquirable monocrystalline silicon of a common semiconductor fabrication process, the present invention has a lower cost for reduced production costs compared to an SOI substrate made of silicon dioxide.

Further, compared to a conventional junction-less transistor on an SOI, the junction-less transistor having the reverse polarity structure of the present invention provides a preferred on/off current ratio.

In addition, in the present invention, characteristics of the junction-less transistor can be adjusted by changing the doping concentration of the substrate. Therefore, compared to a conventional junction-less transistor on an SOI, an additional design parameter is offered for enhanced application flexibilities.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A junction-less transistor having an reverse polarity structure, comprising:
   a substrate, having a first polarity;
   a semiconductor body, disposed on the substrate, comprising a drain, a source and a channel section connected to the drain and the source;
   a gate insulation layer, covering a surface of the channel section which is not in contact with the substrate; and
   a gate, fully covering an outer surface of the gate insulation layer,
   wherein the semiconductor body has a second polarity opposite to the first polarity.

2. The junction-less transistor of claim 1, wherein the semiconductor body is N-type doped and the substrate is P-type doped.

3. The junction-less transistor of claim 1, wherein the semiconductor body is P-type doped and the substrate is N-type doped.

4. The junction-less transistor of claim 1, wherein the substrate has a doping concentration between $10^{15}$ and $10^{20}$ cm$^{-3}$.

5. The junction-less transistor of claim 1, wherein the gate insulation layer is high-dielectric material.

6. The junction-less transistor of claim 1, wherein the substrate has the first polarity by applying a bias voltage.

7. The junction-less transistor of claim 1, wherein the substrate is selected from the group consisting of monocrystalline silicon, thin-film silicon, monocrystalline silicon germanium and gallium arsenide.

* * * * *